(12) United States Patent
Beckers et al.

(10) Patent No.: US 7,136,142 B2
(45) Date of Patent: Nov. 14, 2006

(54) LITHOGRAPHIC APPARATUS HAVING A GAS FLUSHING DEVICE

(75) Inventors: Marcel Beckers, Eindhoven (NL); Ronald Johannes Hultermans, Utrecht (NL); Nicolaas Ten Kate, Almkerk (NL); Nicolaas Rudolf Kemper, Eindhoven (NL); Nicolaas Franciscus Koppelaars, Oisterwijk (NL); Jan-Marius Schotsman, Rijen (NL); Ronald Van Der Ham, Maarheeze (NL); Johannes Antonius Maria Martina Van Uijtregt, Eersel (NL)

(73) Assignee: ASML Netherlands B.V., Veldhoven (NL)

( * ) Notice: Subject to any disclaimer, the term of this patent is extended or adjusted under 35 U.S.C. 154(b) by 112 days.

(21) Appl. No.: 10/852,686

(22) Filed: May 25, 2004

(65) Prior Publication Data

US 2005/0264773 A1    Dec. 1, 2005

(51) Int. Cl.
*G03B 27/52* (2006.01)
*G03B 27/42* (2006.01)

(52) U.S. Cl. .............................. 355/30; 355/53; 355/55
(58) Field of Classification Search ................ 355/30, 355/53, 55, 67; 250/492.2, 548; 356/500
See application file for complete search history.

(56) References Cited

U.S. PATENT DOCUMENTS 4,692,934 A    9/1987 Forsyth

| | | | |
|---|---|---|---|
| 5,141,318 A | 8/1992 | Miyazaki et al. | |
| 5,906,429 A | 5/1999 | Mori et al. | |
| 6,542,220 B1 | 4/2003 | Schrijver et al. | |
| 6,721,031 B1 * | 4/2004 | Hasegawa et al. | 355/30 |
| 2001/0026402 A1 | 10/2001 | Gerhard et al. | |

FOREIGN PATENT DOCUMENTS

JP    9-22121    1/1997

OTHER PUBLICATIONS

European Search Report for European Application No. 05076194.9, dated Aug. 3, 2005.

* cited by examiner

*Primary Examiner*—Peter B. Kim
(74) *Attorney, Agent, or Firm*—Pillsbury Winthrop Shaw Pittman LLP

(57) ABSTRACT

A lithographic apparatus is disclosed. The apparatus includes an illumination system to provide a beam of radiation, and a support structure for supporting a patterning device. The patterning device serves to impart the beam with a pattern in its cross-section. The apparatus also includes a gas flushing device for flushing a substantially laminar flow of gas across the beam of radiation and/or along a surface of an optical component. The gas flushing device includes a single gas outlet that has an inner rim at a downstream end of the gas outlet. The inner rim defines a total gas outlet area. The gas outlet is provided with a laminator that has an effective area out of which, in use, the substantially laminar flow of gas flows. The laminator effective area includes material that has laminator openings and is at least as large as the total gas outlet area.

47 Claims, 5 Drawing Sheets

LITHOGRAPHIC APPARATUS HAVING A GAS FLUSHING DEVICE

BACKGROUND OF THE INVENTION

1. Field of the Invention

The present invention relates to a lithographic apparatus having a gas flushing device and relates to a gas flushing device for flushing a substantially laminar flow of gas across a predetermined space in, for example, a lithographic apparatus.

2. Description of Related Art

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (including, for example, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti parallel to this direction.

More particularly, the invention relates to a lithographic apparatus that includes: an illumination system for providing a projection beam of radiation, and a support structure for supporting a patterning device. The patterning device serves to impart the projection beam with a pattern in its cross-section. The apparatus also includes a substrate table for holding a substrate, a projection system for projecting the patterned beam onto a target portion of the substrate.

The projection system usually includes an optical component such as a lens for focusing the beam onto the target portion of the substrate. It is, however, as will be pointed out in slightly more detail further on in this specification, also possible to direct the beam via reflective components such as mirrors. The surfaces of these optical components may interact with gaseous contaminants in such a way that the transmission of light or the reflection of light occurs in a less accurate manner than would be the case had the surfaces of the optical components not interacted with these gaseous contaminants.

The result of the interaction may result in a hindrance of the transmission or reflection of light via these optical components. That is, due to the interaction, a layer may be formed on or into the surface of the optical opponent, changing the transmission coefficient or reflection coefficient of the optical component. This change may have a permanent nature. As the optical components are usually very expensive components of the apparatus, a reduction of the lifetime of these components due to interaction with these particles is highly undesirable. In this document often the term "particles" is used as part of contaminating gases. It should be understood that these particles may have molecular dimensions.

The gaseous contaminants interacting with these optical components may be released by the wafer substrate, for example, before exposure of the substrate to the beam as a result of, for example, outgassing, during exposure of the substrate to the beam as a result of the removal of material from the substrate, or after exposure of the substrate to the beam as a result of for example baking out the substrate. These gaseous contaminants may also be present in the lithographic apparatus. Particles which may interact with the surface of an optical component may also be formed during for example production of UV radiation. The interaction with the optical components may occur under the influence of the radiation. Most often though, gases from the wafer or from elsewhere present in the lithographic apparatus interact under the influence of the radiation with a coating on the surface of an optical component. Due to a chemical reaction, crystals are formed, which negatively affect the performance of the optical component. To remove these crystals, the apparatus has to be opened up, which results in down time and hence expenses. Sometimes the crystals cannot be cleaned away and the optical element has to be replaced by a new one.

One way of preventing the interaction of the gaseous contaminants with a surface of an optical component is carried out by flushing a flow of gas along a surface of an optical component to drag away, within the flow of gas, contaminating particles which were about to approach the surface of the optical component. It may also be useful to provide the flow of gas across the patterned projection beam in order to prevent particles traveling along a path followed by the patterned projection beam from reaching a surface of the optical components. A flow of gas may also be provided both across the patterned projection beam and along a surface of an optical component. If the flow of gas is provided across the patterned projection beam, or any other beam of radiation for that matter, the flushing gas is preferred to be substantially non-absorbent of the radiation used in the projection system. The flow of gas is also strongly preferred to be a substantially laminar flow of gas in order to improve the shielding effect of the flow of gas.

EP 1098226 A2 describes a lithographic apparatus with a gas flushing device. The device includes a number of spaces, stacked in a parallel fashion on top of each other. In use, gas flows along the parallel direction through each of these spaces. To ensure laminar flow and minimize turbulence, the various spaces are spatially separated from one another. Although this system provides, in many situations, a useful way of flushing a laminar flow of gas across the patterned projection beam and/or along a surface of an optical component, the system disadvantageously occupies too much space, as determined by the minimum distance between, for example, a surface of an optical component and a source for particles. In fact, due to the presence of a gas flushing device as described in this prior art, the distance between a bottom of the projection system and the substrate table has to be undesirably large.

In this context, it is worth noting that in the field of projecting a beam onto a target portion of the substrate, the current tendency is aimed at more accurate projections, demanding a higher numerical aperture number NA. Between the substrate and the bottom of, for example, a final lens element of the projection system, there needs to be a distance for allowing flushing away the gaseous contaminants. If the distance needs to be large and the NA number needs to be high, the bottom of the lens has to be relatively large.

As fabrication, machining etc. of the bottom of this lens is a very expensive process, it is preferred that the bottom of the lens be much smaller. With the high NA number, the distance between the substrate and the bottom of the lens is preferably as small as possible; and is large enough to just be able to transport the wafer without hitting the lens.

BRIEF SUMMARY OF THE INVENTION

It is an aspect of the present invention to provide a lithographic apparatus having a gas flushing device which allows for placement of the gas flushing device between a surface of an optical component and a substrate closely situated opposite that surface of the optical component, without occupying too much space between the surface of the optical component and the substrate.

It is an aspect of the present invention to provide a lithographic apparatus having a gas flushing device for flushing a substantially laminar flow of gas across the patterned projection beam of radiation and/or along a surface of an optical component.

It is an aspect of the present invention to provide a lithographic apparatus having a gas flushing device which allows for a laminar flow of gas which is not easily crossable by a particle.

It is an aspect of the present invention to provide a lithographic apparatus having a gas flushing device which is approximately as flat as the flow of gas produced by the gas flushing system.

It is an aspect of the present invention to provide a lithographic apparatus having a gas flushing device which allows for production of a laminar flow of gas which is homogeneous across the laminar flow of gas.

It is an aspect of the present invention to provide a lithographic apparatus having a gas flushing device which is simple in its design and manufacture.

It is an aspect of the present invention to provide a gas flushing device which allows for placement of the gas flushing device between a surface of an optical component and a substrate closely situated opposite that surface of the optical component, without occupying too much space between the surface of the optical component and the substrate.

It is an aspect of the present invention to provide a gas flushing device which allows for a laminar flow of gas which is not easily crossable by a particle.

It is an aspect of the present invention to provide a gas flushing device which is approximately as flat as the flow of gas produced by the gas flushing device.

It is an aspect of the present invention to provide a gas flushing device which allows for production of a laminar flow of gas which is homogeneous across the laminar flow of gas.

It is an aspect of the present invention to provide a gas flushing device which is simple in its design and manufacture.

According to an aspect of the invention, there is provided a lithographic apparatus that includes an illumination system for providing a projection beam of radiation, and a support structure for supporting a patterning device. The patterning device serves to impart the projection beam with a pattern in its cross-section. The apparatus also includes a substrate table for holding a substrate, a projection system for projecting the patterned beam onto a target portion of the substrate, and a gas flushing device for flushing a substantially laminar flow of gas across the beam of radiation and/or along a surface of an optical component. The device includes a single gas outlet that has an inner rim at a downstream end of the gas outlet. The inner rim defines a total gas outlet area of the gas flushing device. The gas outlet is provided with a laminator that has an effective area out of which, in use, the laminar flow of gas flows. The effective area includes material that has laminator openings. The effective area is at least as large as the total gas outlet area. As the flow of gas in use leaves the laminator is not divided up in smaller flows which flow parallel to each other, the whole gas outlet area of the single outlet can be used for producing the laminar flow of gas. In other words, the flow leaving the laminator is a substantially uniform flow with respect to a cross section of the total flow. No loss occurs in terms of the cross sectional area of the flow upstream of the laminator with respect to the cross sectional area downstream of the laminator. This has the advantage that it is possible to have a continuous flow with a cross section at least as large as the total gas outlet area. This allows for a laminar flow of gas that is dense enough to prevent gaseous contaminants to travel across the laminar flow of gas. As the flow of gas can be dense, the flow can also have a cross section which is relatively small without compromising its effectiveness. This further allows for a single outlet with a relatively small gas outlet area. Ultimately, this means that the distance between, for example, a bottom of a projection system and a substrate table can be less than the necessary distance in an apparatus described in the prior art.

Accordingly, the gas flushing device may be arranged to provide the substantially laminar flow of gas between the projection system and the substrate table. This allows a bottom of a lens facing the substrate table, or a surfaceof a mirror facing the substrate table, to be protected from interaction with particles originating from the substrate.

According to an embodiment of the invention, the laminator is oriented such that, in use, the laminar flow of gas leaving the gas outlet approaches a bottom of the projection system under an angle so that the laminar flow of gas accelerates, thereby preventing the laminar flow of gas from becoming turbulent. The acceleration of the laminar flow of gas occurs as the flow is directed towards the bottom of the projection system. As the flow accelerates, laminarity increases. This is schematically illustrated in the figures. The more laminar a flow of gas, the more capable the flow of gas is of providing a shield for a bottom of a lens, or for a surface of a mirror, against gaseous contaminants which approach the lens or mirror.

According to an embodiment of the invention, the gas flushing device includes a conduit which ends up in the gas outlet for flowing gas towards the gas outlet. The conduit is oriented substantially parallel to the bottom of the projection system and/or the substrate table. This allows for placing the gas outlet such that a minimum distance between the bottom of the projection system and the substrate table is necessary for applying the laminar flow of the gas. Usually the bottom of the projection system, i.e. the lens or mirror, is parallel to the substrate table. Especially in a situation where the laminator is oriented such that the laminar flow of gas approaches a bottom of the projection system under an angle, by placing the laminator inclined with respect to the orientation of the conduit, an effective laminar flow may be flushed along the bottom of the projection system without having much distance between the bottom of the projection system and the substrate table.

According to an embodiment of the invention, the gas flushing device further comprises a gas inlet for sucking in the substantially laminar flow of gas. This provides a laminar flow of gas that can, in use, remain laminar over a relatively long distance, as no pressure build-up occurs. The flow remains laminar over a longer path as compared to a situation in which no gas inlet is present.

According to an embodiment of the invention, the gas inlet is substantially situated opposite the gas outlet. This further aids the flow, in use, to remain laminar.

According to an embodiment of the invention, the gas outlet and the gas inlet are connected such that a volume is defined between the gas outlet and the gas inlet. The volume has, in a direction substantially parallel to the patterned beam, a dimension which is similar to the dimension of the effective grid surface area in the direction substantially parallel to the patterned beam. In this embodiment, the laminar flow of gas is surrounded by barriers so that gas flows coming from directions towards these barriers, cannot disturb the laminar flow of gas.

According to another aspect of the invention, there is provided a gas flushing device for flushing a substantially laminar flow of gas across a predetermined space in, for example, a lithographic apparatus. The gas flushing device includes a single gas outlet that has an inner rim at a downstream end of the gas outlet. The inner rim defines a total gas-outlet area of the gas flushing system. The gas outlet is provided with a laminator having an effective area out of which, in use, the laminar flow of gas flows. The effective area includes material and laminator openings. The effective area is at least as large as the total gas outlet area.

In an embodiment, the gas flushing device includes a conduit which ends up in the gas outlet for flowing gas in a first direction towards the gas outlet. The laminator grid is inclined with respect to the first direction, so that in use gas flows out of the gas outlet in a second direction, which is inclined with respect to the first direction. This embodiment allows for an effective area which is larger than a cross section of the conduit. This embodiment further allows for a laminar flow of gas to be directed towards a surface under an angle so that the laminar flow of gas accelerates when flowing along that surfaces, thereby preventing the laminar flow of gas from becoming turbulent.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF THE INVENTION

Figure 1:
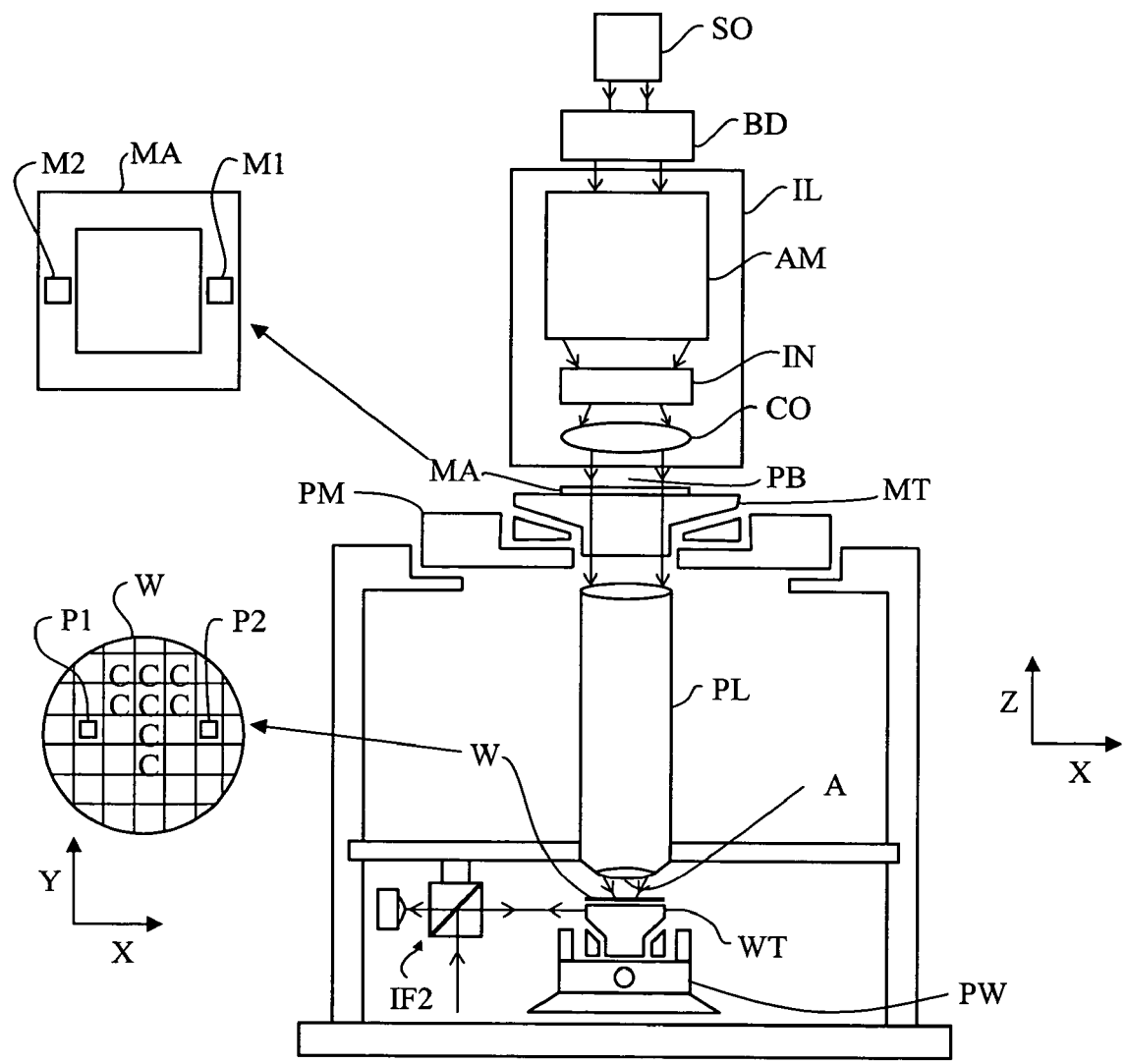
FIG. 1 depicts schematically a lithographic apparatus according to an embodiment of the invention.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example, in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm).

The term "patterning device" used herein should be broadly interpreted as referring to a device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of the patterning device, the support structure may be a frame or table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

FIG. 1 schematically depicts a lithographic apparatus according to a particular embodiment of the invention. The apparatus includes: an illumination system (illuminator) IL for providing a projection beam PB of radiation (e.g. UV or EUV radiation); a first support structure (e.g. a mask table) MT for supporting a patterning device (e.g. a mask) MA and connected to a first positioning device PM for accurately positioning the patterning device with respect to item PL; a substrate table (e.g. a wafer table) WT for holding a substrate (e.g. a resist coated wafer) W and connected to a second positioning device PW for accurately positioning the substrate with respect to item PL; and a projection system (e.g. a reflective projection lens) PL for imaging a pattern imparted to the projection beam PB by the patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example, when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may include an adjusting device AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally includes various other components, such as an integrator IN and a condenser CO. The illuminator provides a conditioned beam of radiation, referred to as the projection beam PB, having a desired uniformity and intensity distribution in its cross section.

The projection beam PB is incident on the mask MA, which is held on the mask table MT. Having traversed the mask MA, the projection beam PB passes through the lens PL, which focuses the beam onto a target portion C of the substrate W. With the aid of the second positioning device PW and position sensor IF2 (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The illuminator IL receives a beam of radiation from a radiation source SO. The source and the lithographic apparatus may be separate entities, for example when the source is a plasma discharge source. In such cases, the source is not considered to form part of the lithographic apparatus and the radiation beam is generally passed from the source SO to the illuminator IL with the aid of a radiation collector comprising for example suitable collecting mirrors and/or a spectral purity filter. In other cases the source may be integral part of the apparatus, for example when the source is a mercury lamp. The source SO and the illuminator IL, may be referred to as a radiation system.

The illuminator IL may include an adjusting device for adjusting the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation, referred to as the projection beam PB, having a desired uniformity and intensity distribution in its cross section.

The projection beam PB is incident on the mask MA, which is held on the mask table MT. Being reflected by the mask MA, the projection beam PB passes through the lens PL, which focuses the beam onto a target portion C of the substrate W. With the aid of the second positioning device PW and position sensor IF2 (e.g. an interferometric device), the substrate table WT can be moved accurately, e.g. so as to position different target portions C in the path of the beam PB. Similarly, the first positioning device PM and position sensor (not shown) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

The lithographic apparatus as shown in FIG. 1 may include, according to the invention, a gas flushing device for flushing a substantially laminar flow of gas across the beam of radiation and/or along a surface of an optical component. Such a device may, for example, be employed at a position indicated by A in FIG. 1 between the bottom of the projection system PL and the substrate table WT to prevent gaseous contaminants coming from substrate W or from elsewhere within the lithographic apparatus to reach the bottom of the projection system PL.

Figure 2:
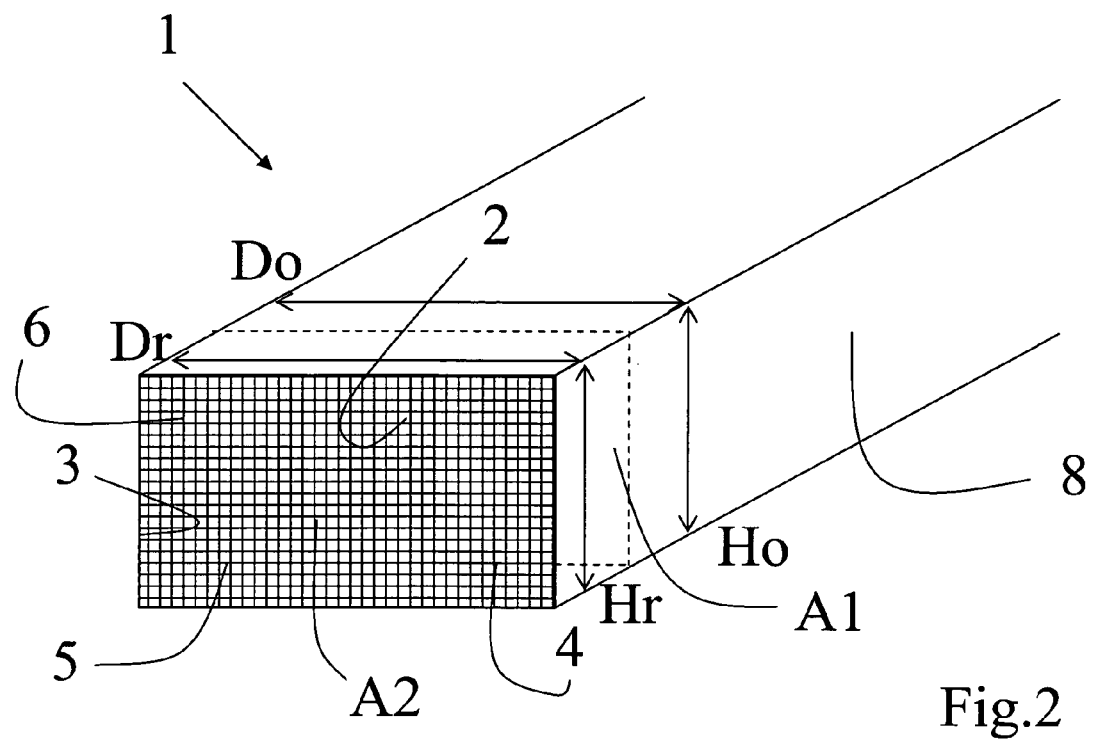
FIG. 2 depicts schematically a gas outlet of a gas flushing device according to an embodiment of the invention.

FIG. 2 shows at least a part of a gas flushing device 1 according to the invention. The device comprises a single gas outlet 2 having an inner rim 3 at a downstream end of the gas outlet 2. The inner rim 3 defines a total gas outlet area of the gas flushing device 1. The gas outlet 2 is further provided with a laminator 4 out of which, in use, the substantial laminar flow of gas flows. The laminator 4 has an effective area A2 comprising grid material 5 and laminator openings. The effective area A2 is at least as large as the total gas outlet area A1. This is easily seen in FIG. 2 as the width Dr of the laminator 4 and the height Hr of the laminator 4 are equally as large as respectively the width Do of the gas outlet area Al and the height Ho of the gas outlet area A1. Although the laminator 4 is shown as a grid, it should be born in mind that the laminator 4 may very well comprise a sheet with circular openings, usually equally distributed over the sheet. The openings may thus have different shape, for example circular, than the shape shown in the drawing (FIGS. 2 and 4).

Figure 3:
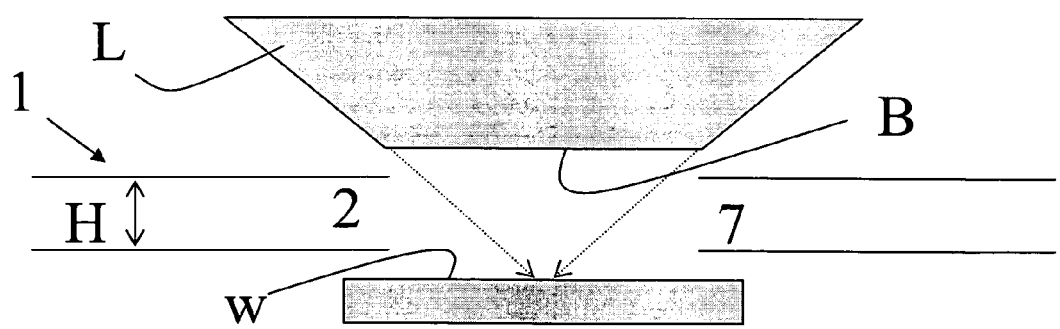
FIG. 3 depicts in detail schematically a part of a lithographic apparatus according to an embodiment of the invention.

FIG. 3 shows schematically a bottom B of the projection system and a wafer W on to which radiation beams leaving the projection system, are directed. Some of the outer radiation beams are indicated by dashed arrows. The gas flushing device 1 is arranged to provide a substantially laminar flow of gas between the bottom of the projection system (in this figure, bottom B of lens L) and the substrate table (not shown in this figure) on which in this figure the wafer W is placed. The gas flushing device as shown comprises a gas outlet 2 and a gas inlet 7 for sucking in the substantially laminar flow of gas. The gas inlet 7 will be discussed in more detail further below.

In FIG. 3, it can easily be seen that when focused use of the outer radiation beams as shown by the dotted arrows is desired, the area of the bottom B of the projection lens L would have to be much larger if the height H of the gas flushing device 1 were to be larger, for example, as large as shown in EP 109 8 226 A2.

Figure 4:
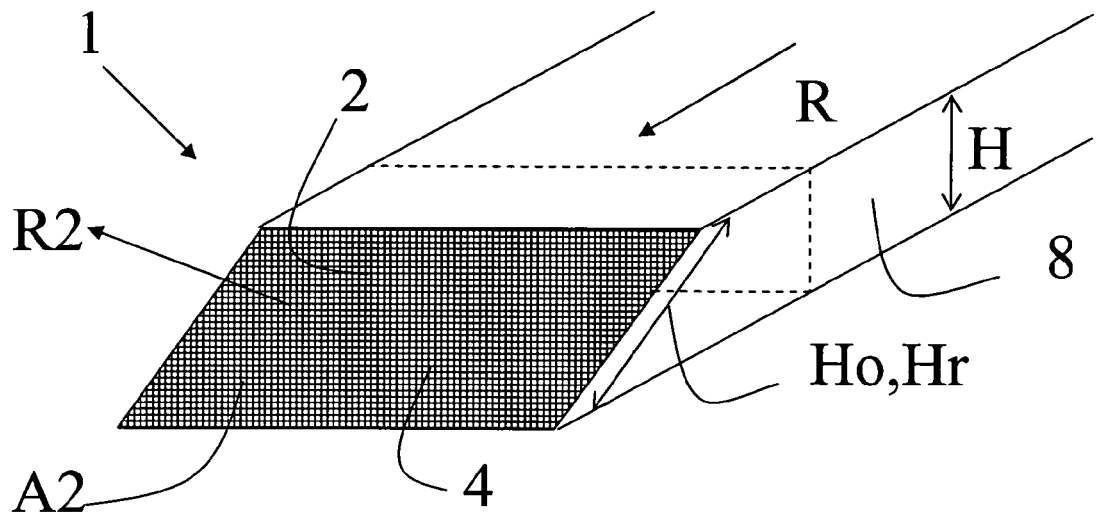
FIG. 4 depicts schematically another gas outlet of a gas flushing device according to an embodiment of the invention.
Figure 5:
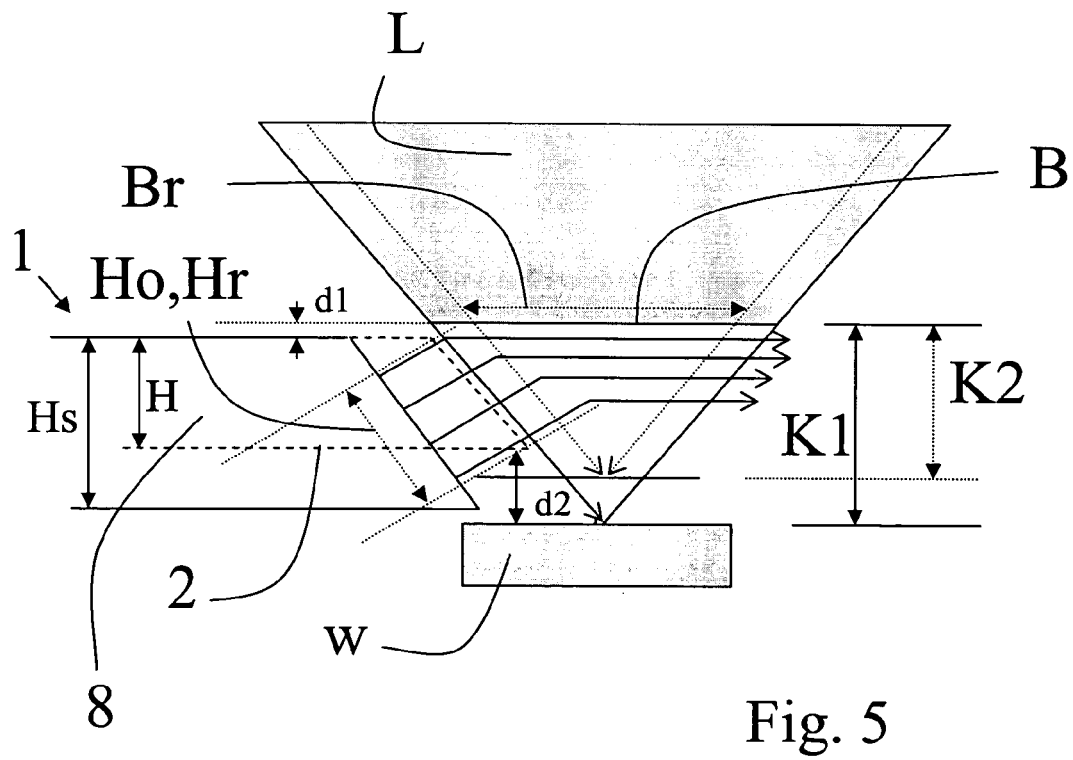
FIG. 5 depicts schematically in more detail a part of a lithographic apparatus according to an embodiment of the invention when the gas flushing device is in use.

FIG. 4 shows another embodiment of a gas flushing device 1 according to the invention. The gas flushing device 1 comprises a conduit 8 which ends up in the gas outlet 2 for flowing gas in a first direction towards the gas outlet 2. The first direction is indicated by arrow R. The laminator 4 is in this embodiment inclined with respect to the first direction, so that in use gas flows out of the gas outlet in a second direction R2, which is inclined with respect to the first direction and in this figure more or less perpendicular to the laminator 4. In this embodiment the effective area A2 is again at least as large as the total gas outlet area. However, the height H of the conduit 8 is much less than the height Ho and Hr of, respectively, the total gas outlet area A1 and the effective area A2. The advantage of this is shown in FIG. 5. The laminator 4 is oriented such that, in use, the laminar flow of gas leaving the gas outlet 2 approaches the bottom B of the projection system under an angle. As a result the laminar flow accelerates when it has to change of direction from flowing towards the bottom of the projection system to flowing along the bottom of the projection system. It should be noted that the conduit 8 of the gas flushing device ends up in the gas outlet 2 for flowing gas towards the gas outlet 2. This conduit however is oriented substantially parallel to the bottom of the projection system and/or the substrate table. (The substrate table itself is not shown in FIGS. 4 and 5, however, the wafer is normally located on this substrate table).

The conduit 8 ending up in the gas outlet 2 as shown by solid lines in FIG. 5 is situated at some distance from the bottom B of the lens L to clearly show the change of direction of the laminar flow of gas. In FIG. 5, however, is also shown by dashed lines how the situation would be if the conduit 8 and the gas outlet 2 were to be situated much closer to the bottom B of the projection lens. Instead of having a distance K1 between the bottom of the projection system and the surface of the wafer, the distance between the bottom of the projection system and the surface of the wafer could be K2, being much smaller than K1. The bottom of the projection system, which would be the bottom of the lens L, can have a size indicated by arrow Br, which, as compared to the situation in which the conduit 8 and the gas outlet 2 are situated as shown by the solid lines, is a lot smaller than the size of the bottom B of lens L, as shown. When the bottom of the lens B can be a lot smaller, a substantial reduction in the expenses for the fabrication of the bottom of the lens can be achieved. In practice, the conduit 8 ending up in gas outlet 2 is situated with respect to the bottom of lens L as shown by the conduit and gas outlet drawn in dashed lines. A distance d1 between the bottom B of lens L and an upperside of conduit 8 in the direction of arrow K1 and K2 is typically 0.3 mm. The distance d2 between an underside of the conduit and the wafer, in the direction of arrows K1 and K2, i.e. K2−K1, is typically about 2 mm. Also is clearly visible in FIG. 5 that the reduction in height of the conduit shown in dashed lines with respect to the conduit 8 in solid lines, namely Hs-H, does not necessarily alter the flow of gas directed towards the bottom B of lens L.

Figure 6:
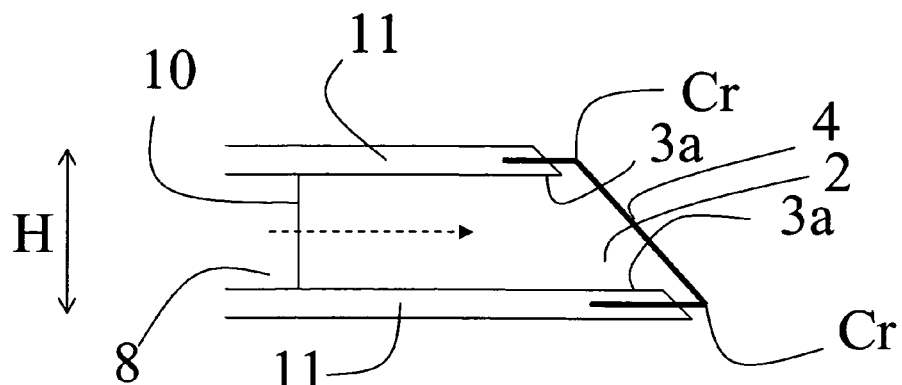
FIG. 6 depicts schematically in cross section a gas outlet of an embodiment of a gas flushing device according to the invention.

FIG. 6 shows a cross section of a gas flushing device 1 that includes a gas outlet 2 and the rim 3. The device 1 includes a single gas outlet 2 having an inner rim 3a at a downstream end of the gas outlet 2. The gas outlet 2 is provided with a laminator 4 out of which, in use, the substantially laminar flow of gas flows. The laminator 4 is connected to a part of the rim 3 that is situated outside the inner rim 3a. The laminator 4 may, for example, include nickel as grid material. For connection to the gas outlet, the laminator may be folded, bent or otherwise mechanically processed at corners Cr to allow for connection to the gas outlet 2. As the laminator 4 is connected to a part of the rim 3 that is situated outside the inner rim 3a, the laminator 4 can be at least as large as the gas outlet area. Attachment of the laminator to the rim is possible in a variety of different ways, as would be appreciated by on of ordinary skill in the art.

Figure 7:
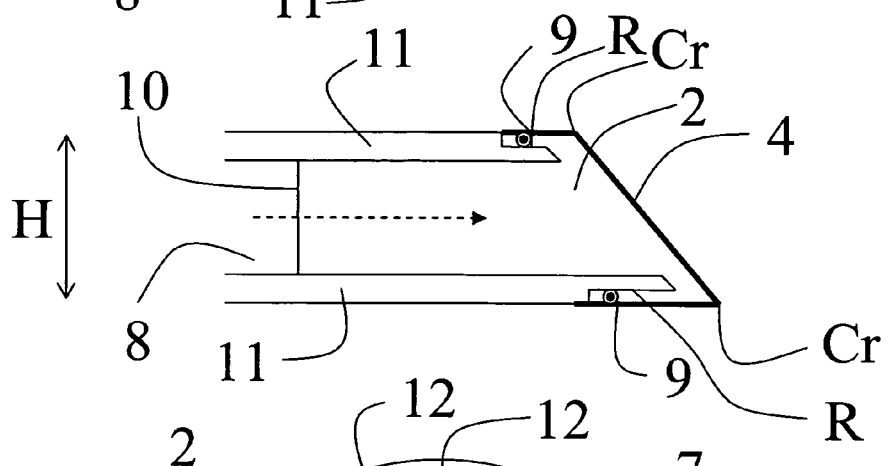
FIG. 7 depicts schematically in cross section a gas outlet of another embodiment of a gas flushing device according to the invention.

FIG. 7 shows schematically a cross section of an alternative embodiment of a gas flushing device 1 according to the invention. In this case the laminator 4 is connected to an outer side of the gas outlet 2. The laminator 4 is connected to the gas outlet 2 by welding connections 9. Welding may in this context encompass soldering, brazing, etc.

It is possible, that, as shown, the gas outlet 2 comprises a recess R for accommodating a circumference of the laminator 4 so that the rectifier laminator grid is flush with an outer side of the gas outlet 2. This means that the connection of the laminator does not enhance the effective height of the gas flushing device, which means on its turn that the distance between the bottom of the projection system and the wafer does not need to be enhanced due to the size of the gas flushing device. It is of course also possible that the laminator is flush with an inner side of the gas outlet 2. As long as the effective grid area A2 of the laminator 4 is at least as large as the total gas outlet area A1 of the gas outlet 2, an optimal situation in terms of a minimum of the size of the gas flush device and an effective laminar flow can be achieved. It should be noted that in both FIG. 6 and FIG. 7 the effective grid area A2 is actually larger than the total gas outlet area A1.

It should further be noted that the gas outlet 2 comprises a flow straightener 10 for homogenizing the velocity of the gas flow over an inner cross section of the gas outlet 2 downstream of the flow straightener 10. The flow straightener 10 comprises a sheet of material having openings, each with a diameter of generally less than 100 microns. The openings generally may have a diameter of less than 50 microns. More preferably, the openings have a diameter of less than 20 microns. The openings of the flow straightener 10 may comprise at least 1% and less than 5% of the area of the flow straightener 10. Preferably the openings comprise about 2% of the flow straightener 10. The grid laminator openings 6 of the laminator 4 have a diameter of generally less than 200 microns. Preferably, the laminator openings 6 have a diameter of generally less than 100 microns. Even more preferable is that the laminator openings 6 have a diameter of generally less than 40 microns. The laminator openings 6 may comprise at least 10% and less than 30% of the effective area of the laminator. Preferably the laminator openings 6 comprise about 20% of the effective area. As stated before, the laminator 4 may include a metal, such as nickel. The gas outlet 2 may substantially include a material of the group consisting of aluminum or steel, or any combinations thereof. With this material, a very thin wall 11 of the conduit 8 and the gas outlet 2 can be produced, so that an optimum can be found in terms of a maximum gas outlet area and a minimum height H of the gas flushing device 1. Also, other materials which are easily machineable and allow for production of a relatively stiff gas flushing device, even though the walls of the device may be very thin, can be employed for the production of the gas flushing device.

As stated before, the gas flushing device 1 may further comprise a gas inlet 7 for sucking in the substantially laminar flow of gas. A result of this is that the laminar flow of gas will remain laminar over a much longer path as compared to a situation without a gas inlet 7 for sucking in the flow of gas. The gas inlet 7 is substantially situated opposite the gas outlet 2. The gas outlet 2 is in shape at least similar to the gas inlet 7. Preferably, the gas inlet 7 is, in terms of its dimensions, similar to the gas outlet 2.

Figure 8:
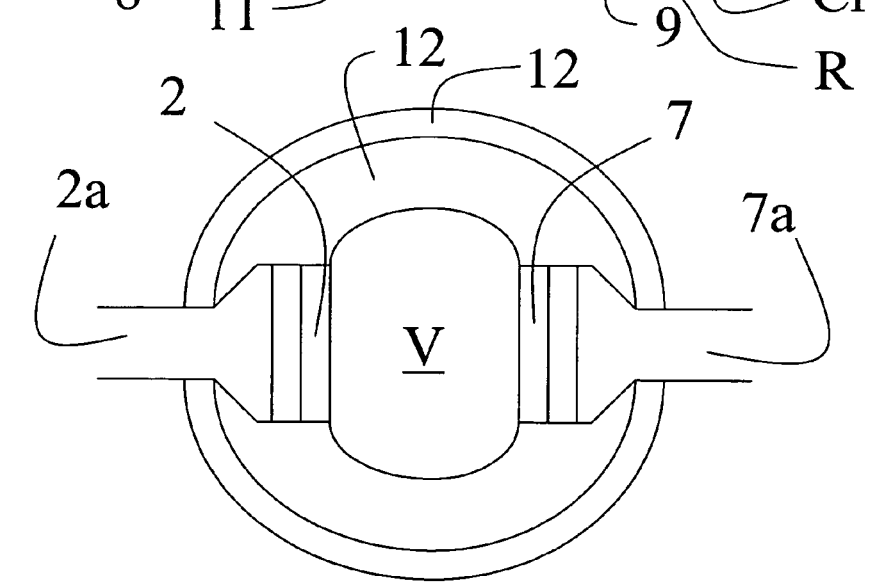
FIG. 8 depicts schematically a top view of an embodiment of a gas flushing device according to the invention.
Figure 9:
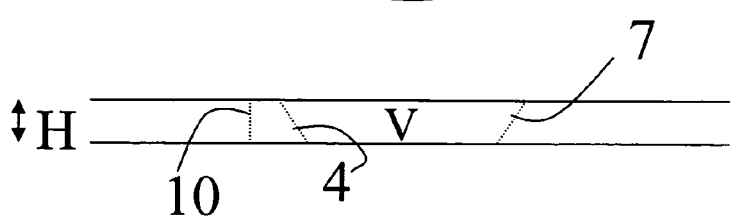
FIG. 9 depicts schematically a side-view of the gas flushing device shown in FIG. 8.

FIGS. 8 and 9 show an embodiment of a gas flushing device 1 in which the gas outlet 2 and the gas inlet 7 are connected such that a volume V is defined between the gas outlet 2 and the gas inlet 7. This volume V has in a direction substantially parallel to the patterned beam, a dimension H which is similar to the dimension of the effective area in a direction substantially parallel to the patterned beam. This means that the total height H of the gas flushing device 1 is determined by the dimension of the effective grid surface area in a direction substantially parallel to the pattern beam. The gas flushing device 1 may thus be very thin or may have a substantially flat shape. As outlined before, this means that the distance between the bottom of the projection lens and the wafer may be relatively small, allowing for a small bottom of the projection lens without compromising on the accuracy of the projection of the beam on to the target position on the wafer.

FIG. 8 shows a top view of an embodiment having connections 12 between the gas outlet 2 and the gas inlet 7. Tube 2a forms a connection for a supply of gas. Tube 7a forms a connection for an exhaust of gas. The volume defined between the gas outlet 2 and the gas inlet 7 is indicated by V. Such a device may easily be machined from steel or aluminium. The laminator 4 (not showing FIG. 8) may easily be connected to gas outlet 2 by for example a welding connection. As stated before the laminator itself may comprise sheets of metal such as nickel wherein by means of an electrochemical machining method, well-known in itself, openings have been formed.

FIG. 9 shows a side view of the embodiment shown in FIG. 8. Laminator 4 and flow straightener 10 are shown by dotted lines.

Figure 10:
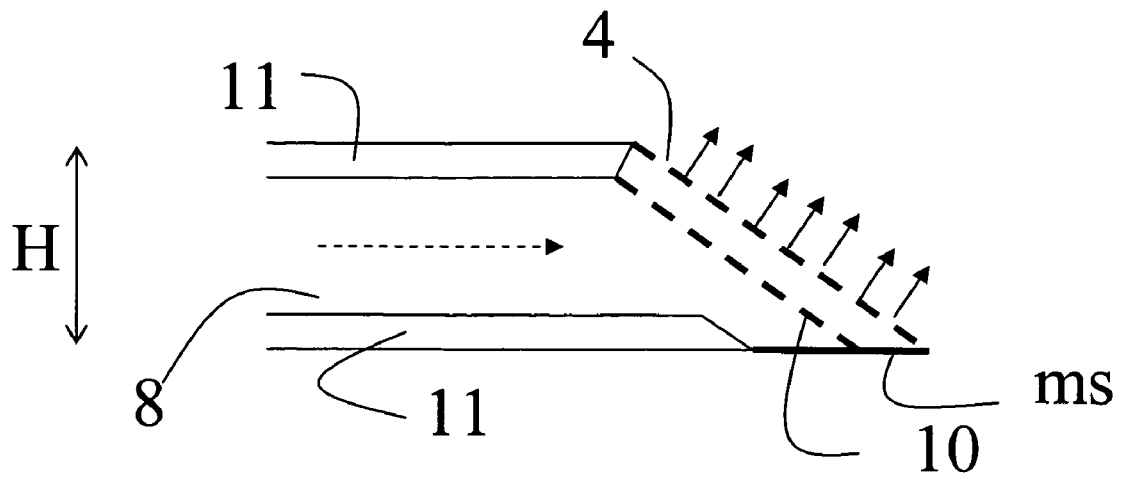
FIG. 10 depicts schematically in cross section a gas outlet of yet another embodiment of a gas flushing device according to the invention.
Figure 11:
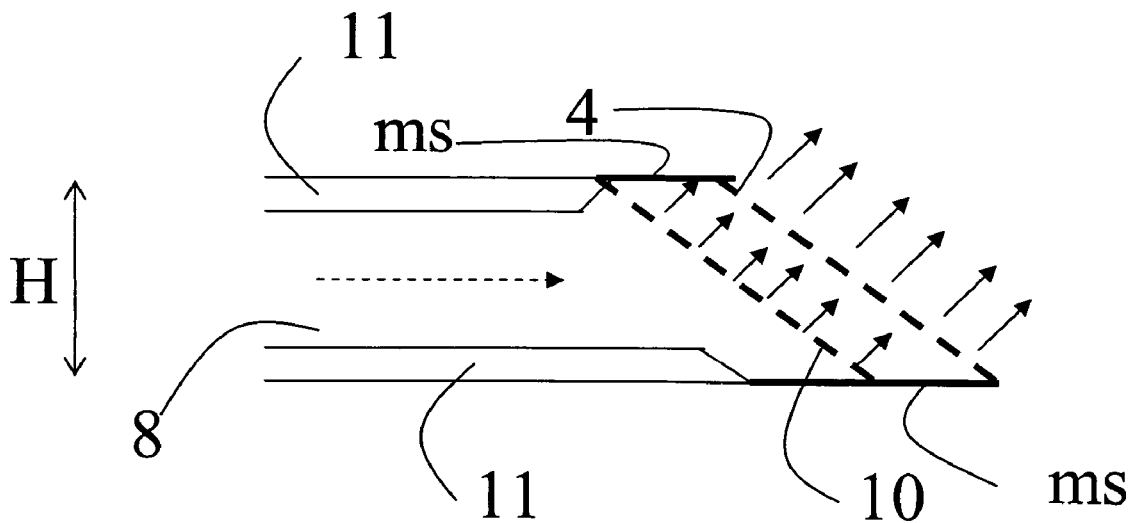
FIG. 11 depicts schematically in cross section a gas outlet of yet another embodiment of a gas flushing device according to the invention.

FIG. 10 and FIG. 11 each show, in cross section, an embodiment of a gas outlet of a flushing device according to the invention. In these embodiments the laminator 4 and the flow straightener 10 are parallel to each other. The laminator 4 and the flow straightener 11 10 may both on one side (FIG. 10) or on both sides (FIG. 11) be connected to a metal sheet ms, which is connected to the rim of thin walls 11 of the conduit 8.

In use, the gas flushing device may be arranged to provide filtered air as gas. For this purpose, the gas flushing device may be provided with an air supply and a filtering system. It has been found that filtered air hardly absorbs radiation with a wavelength larger than 200 nanometers. For lithographic apparatuses using radiation with a wavelength larger than 200 nanometers, a supply of gas by means of supplying filtered air provides a very inexpensive way of protecting a bottom of the projection system.

As described above specific embodiments of the invention, it will be appreciated that the invention may be practiced otherwise then described. The description is not intended to limit the invention. In particular, it will be appreciated that the invention may be used at other positions within the lithographic apparatus then between the substrate table and the bottom of the projection system.

What is claimed is:

1. A lithographic apparatus comprising:
an illumination system to provide a beam of radiation;
a support structure constructed to support a patterning device, the patterning device serving to impart the beam of radiation with a pattern in its cross-section;
a substrate table for holding a substrate;
a projection system for projecting the patterned beam onto a target portion of the substrate; and
a gas flushing device for flushing a substantially laminar flow of gas across the beam of radiation and/or along a surface of an optical component, the gas flushing device comprising
a single gas outlet having an inner rim at a downstream end of the gas outlet, the inner rim defining a total gas outlet area of the gas flushing device, and
a laminator at the downstream end of the gas outlet, the laminator having an effective area out of which the substantially laminar flow of gas flows, the laminator effective area comprising material having laminator openings,
wherein the effective area is at least as large as the total gas outlet area.

2. A lithographic apparatus according to claim 1, wherein the gas flushing device is arranged to provide the substantially laminar flow of gas between a bottom of the projection system and the substrate table.

3. A lithographic apparatus according to claim 2, wherein the laminator is oriented such that the laminar flow of gas leaving the gas outlet approaches the bottom of the projection system at an angle relative to the bottom of the projection system so that the laminar flow of gas accelerates, thereby preventing the laminar flow of gas from becoming turbulent.

4. A lithographic apparatus according to claim 3, wherein the gas flushing device further comprises a conduit which ends up in the gas outlet for flowing gas towards the gas outlet, the conduit being oriented substantially parallel to at least one of the bottom of the projection system and the substrate table.

5. A lithographic apparatus according to claim 1, wherein the laminator is connected to a part of the rim that is situated outside the inner rim.

6. A lithographic apparatus according to claim 1, wherein the laminator is connected to an outer side of the gas outlet.

7. A lithographic apparatus according to claim 1, wherein the laminator is connected to the gas outlet by a weld.

8. A lithographic apparatus according to claim 1, wherein the gas outlet comprises a recess for accommodating a circumference of the laminator so that the laminator is flush with an outer side of the gas outlet.

9. A lithographic apparatus according to claim 8, wherein the recess is situated in the outer rim or in the outer side of the gas outlet.

10. A lithographic apparatus according to claim 1, wherein the gas outlet comprises a flow straightener for homogenizing the velocity of the gas flow over an inner cross-section of the gas outlet downstream of the flow straightener.

11. A lithographic apparatus according to claim 10, wherein the flow straightener comprises a sheet of material having openings with a diameter of generally less than 100 microns.

12. A lithographic apparatus according to claim 11, wherein the openings have a diameter of generally less than 50 microns.

13. A lithographic apparatus according to claim 12, wherein the openings have a diameter generally less than 20 microns.

14. A lithographic apparatus according to claim 1, wherein the laminator openings of the laminator have a diameter of generally less than 200 microns.

15. A lithographic apparatus according to claim 14, wherein the laminator openings have a diameter of generally less than 100 microns.

16. A lithographic apparatus according to claim 15, wherein the laminator openings have a diameter of generally less than 40 microns.

17. A lithographic apparatus according to claim 1, wherein the material of the laminator comprises substantially metal, such as nickel.

18. A lithographic apparatus according to claim 1, wherein the gas outlet substantially comprises at least one material from the group consisting of aluminum and steel.

19. A lithographic apparatus according to claim 1, wherein the gas flushing device further comprises a gas inlet for sucking in the substantially laminar flow of gas.

20. A lithographic apparatus according to claim 1, wherein the gas inlet is substantially situated opposite the gas outlet.

21. A lithographic apparatus according to claim 19, wherein the gas outlet is at least similar to the gas inlet.

22. A lithographic apparatus according to claim 21, wherein the gas inlet includes dimensions similar to the gas outlet.

23. A lithographic apparatus according to claim 21, wherein the gas outlet and the gas inlet are connected such that a volume is defined between the gas outlet and the gas inlet, the volume having in a direction substantially parallel to the patterned beam, a dimension which is similar to the dimension of the effective grid surface area in the direction substantially parallel to the patterned beam.

24. A lithographic apparatus according to claim 1, wherein the gas outlet is provided with a set of at least two laminators oriented substantially parallel to each other.

25. A lithographic apparatus according to claim 1, wherein the gas flushing system is arranged to provide a gas comprising chemically filtered air.

26. A gas flushing device for flushing a substantially laminar flow of gas across a predetermined space in a lithographic apparatus, the gas flushing device comprising:
a single gas outlet having an inner rim at a downstream end of the gas outlet, the inner rim defining a total gas outlet area of the gas flushing device,
a conduit which ends up in the gas outlet for flowing the gas in a first direction towards the gas outlet, and
a laminator at the downstream end of the gas outlet, the laminator having an effective area out of which the substantially laminar flow of gas flows, the laminator effective area comprising material having laminator openings, the laminator being inclined with respect to the first direction, so that gas flows out of the gas outlet in a second direction which is inclined with respect to the first direction,
wherein the effective area is at least as large as the total gas outlet area.

27. A gas flushing device according to claim 26, wherein the laminator is connected to a part of the rim that is situated outside the inner rim.

28. A gas flushing device according to claim 26, wherein the laminator is connected to an outer side of the gas outlet.

29. A gas flushing device according to claim 26, wherein the laminator is connected to the gas outlet by a weld.

30. A gas flushing device according to claim 26, wherein the gas outlet comprises a recess for accommodating a circumference of the laminator so that the laminator is flush with the outlet.

31. A gas flushing device according to claim 30, wherein the recess is situated in the outer rim or in the outer side of the gas outlet.

32. A gas flushing device according to claim 26, wherein the gas outlet comprises a flow straightener for homogenizing, in use, the velocity of the gas flow over an inner cross-section of the gas outlet downstream of the flow straightener.

33. A gas flushing device according to claim 32, wherein the flow straightener comprises a sheet of material having openings, wherein the openings generally have a diameter of less than 100 microns.

34. A gas flushing device according to claim 33, wherein the openings generally have a diameter of less than 50 microns.

35. A gas flushing device according to claim 34, wherein the openings generally have a diameter of less than 20 microns.

36. A gas flushing device according to claim 26, wherein the laminator openings of the laminator generally have a diameter of less than 200 microns.

37. A gas flushing device according to claim 36, wherein the laminator openings of the laminator generally have a diameter of less than 100 microns.

38. A gas flushing device according to claim 37, wherein the laminator openings generally have a diameter of less than 40 microns.

39. A gas flushing device according to claim 26, wherein the laminator substantially comprises metal, such as nickel.

40. A gas flushing device according to claim 26, wherein the gas outlet substantially comprises at least one material from the group consisting of aluminum and steel.

41. A gas flushing device according to claim 26, wherein the gas flushing device further comprises a gas inlet for sucking in the substantially laminar flow of gas.

42. A gas flushing device according to claim 41, wherein the gas inlet is situated opposite the gas outlet.

43. A gas flushing device according to claim 42, wherein the gas outlet is at least in shape similar to the gas inlet.

44. A gas flushing device according to claim 43, wherein the gas outlet is in dimensions similar to the gas inlet.

45. A gas flushing device according to claim 41, wherein the gas outlet and the gas inlet are connected.

46. A gas flushing device according to claim 26, wherein the gas flushing device has a substantially flat shape.

47. A gas flushing device according to claim 26, wherein the gas flushing device is provided with a set of at least two laminators oriented substantially parallel to each other.

* * * * *